(12) United States Patent
Hainz et al.

(10) Patent No.: US 8,183,856 B2
(45) Date of Patent: May 22, 2012

(54) SYSTEM INCLUDING SIGNAL OFFSET ESTIMATION

(75) Inventors: Simon Hainz, Villach (AT); Christof Bodner, Klagenfurt (AT); Mario Motz, Wernberg (AT); Tobias Werth, Villach (AT); Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 435 days.

(21) Appl. No.: 12/428,137

(22) Filed: Apr. 22, 2009

(65) Prior Publication Data

US 2009/0273341 A1 Nov. 5, 2009

Related U.S. Application Data

(60) Provisional application No. 61/049,781, filed on May 2, 2008.

(51) Int. Cl.
*G01B 7/14* (2006.01)

(52) U.S. Cl. ............. 324/207.2; 324/207.21; 324/228; 341/155; 341/118

(58) Field of Classification Search .............. 324/207.2, 324/207.1
See application file for complete search history.

(56) References Cited

U.S. PATENT DOCUMENTS

| 4,727,874 | A | * | 3/1988 | Bowers et al. | .......... 606/38 |
| 5,870,591 | A | * | 2/1999 | Sawada | .......... 713/500 |
| 6,215,426 | B1 | | 4/2001 | Taniguchi et al. | |
| 6,462,683 | B2 | | 10/2002 | Draxelmayr | |

FOREIGN PATENT DOCUMENTS

| DE | 44 35 678 | | 4/1995 |
| DE | 198 44 663 | A1 | 4/2000 |
| DE | 102 13 687 | | 10/2003 |
| DE | 102 13 687 | A1 | 10/2003 |

* cited by examiner

*Primary Examiner* — Roberto Velez
*Assistant Examiner* — Kathryn Chang
(74) *Attorney, Agent, or Firm* — Dicke, Billig & Czaja, PLLC (57) ABSTRACT

A system includes a first circuit configured to convert a first analog signal to a first digital signal. The system includes a second circuit configured to determine an area of the first digital signal above a set value and an area of the first digital signal below the set value to provide a second digital signal indicating an offset of the first analog signal.

14 Claims, 6 Drawing Sheets

SYSTEM INCLUDING SIGNAL OFFSET ESTIMATION

CROSS-REFERENCE TO RELATED APPLICATIONS

This Non Provisional Patent Application claims the benefit of U.S. Provisional Application 61/049,781, filed May 2, 2008, entitled "OFFSET FINE REGULATION BY DIGITAL INTEGRATION," which is incorporated herein by reference.

BACKGROUND

One type of sensor includes an incremental speed sensor for measuring the speed of a target wheel or another suitable object. The output signal from an incremental speed sensor, such as a magnetic incremental speed sensor, is typically sinusoidal-like and includes an offset value. A switch or comparator is typically used to convert the sinusoidal-like signal to a binary or digital signal indicating the speed. The accuracy of the binary signal output by the switch or comparator is typically limited due to the offset value of the sinusoidal signal. Typically, the binary signal output by the switch or comparator should have a duty cycle of 50%. If the input signal to the switch is not offset free, a binary output signal having a duty cycle of 50% is typically not achieved.

For these and other reasons, there is a need for the present invention.

SUMMARY

One embodiment provides a system. The system includes a first circuit configured to convert a first analog signal to a first digital signal. The system includes a second circuit configured to determine an area of the first digital signal above a set value and an area of the first digital signal below the set value to provide a second digital signal indicating an offset of the first analog signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
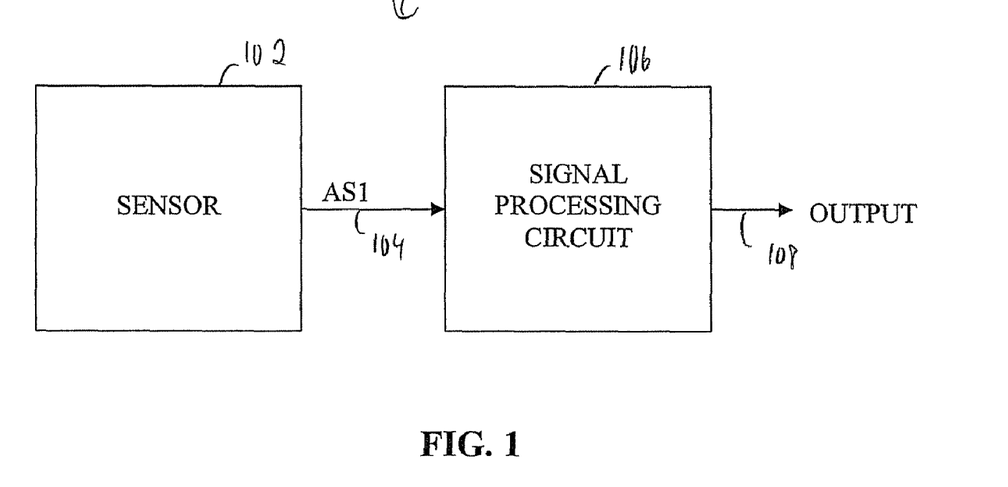
FIG. 1 is a block diagram illustrating one embodiment of a sensor system.

FIG. 1 is a block diagram illustrating one embodiment of a sensor system 100. Sensor system 100 includes a sensor 102 and a signal processing circuit 106. Sensor system 100 is electrically coupled to signal processing circuit 106 through analog signal path (AS1) 104. The output of signal processing circuit 106 provides an output (OUTPUT) signal on OUTPUT signal path 108.

In one embodiment, sensor 102 is an incremental speed sensor or another suitable sensor. In one embodiment, sensor 102 includes a Hall effect sensor, a giant magnetoresistive (GMR) sensor, an anisotropic magnetoresistive (AMR) sensor, a tunnel magnetoresistive (TMR) sensor, or another suitable magnetic field sensor for sensing the speed of a target wheel or another suitable object. In another embodiment, sensor 102 includes a capacitive sensor, an inductive sensor, an optical sensor, a resistive sensor, or another suitable sensor.

Sensor 102 outputs an analog signal AS1 on AS1 signal path 104 indicating the speed. In one embodiment, sensor 102 outputs a sinusoidal signal on AS1 signal path 104. In other embodiments, sensor 102 outputs a sinusoidal-like signal that is generated by a rotating pole wheel or toothed wheel with backbias magnet. In other embodiments, sensor 102 outputs a sawtooth-shaped signal, a triangular-shaped signal, a rectangular-shaped signal, or another suitably shaped analog signal. The shape of the analog signal can be constant or varying over time. This means that at least one of the shape, amplitude, and frequency of the analog signal can also be constant or varying over time. In one embodiment, the analog signal output by sensor 102 includes an offset value. The offset value can be constant (i.e., a DC offset) or varying (i.e., an AC offset) over time.

Signal processing circuit 106 receives the analog signal on AS1 signal path 104 to provide a binary or digital output signal on OUTPUT signal path 108 indicating the speed sensed by sensor 102. In one embodiment, signal processing circuit 106 estimates the offset value of the AS1 signal by combining amplitude information of the AS1 signal with time information and by utilizing digital signal processing and analog tracking techniques. Signal processing circuit 106 includes a digital offset estimation circuit that estimates the offset value of the analog signal. The estimated offset value is then used to remove the offset from the analog signal to provide an offset free analog signal. Signal processing circuit 106 converts the offset free analog signal to a binary or digital signal to provide the OUTPUT signal on OUTPUT signal path 108. In one embodiment, a switch comparator is used to convert the offset free analog signal to a binary signal to provide the OUTPUT signal.

Figure 2:
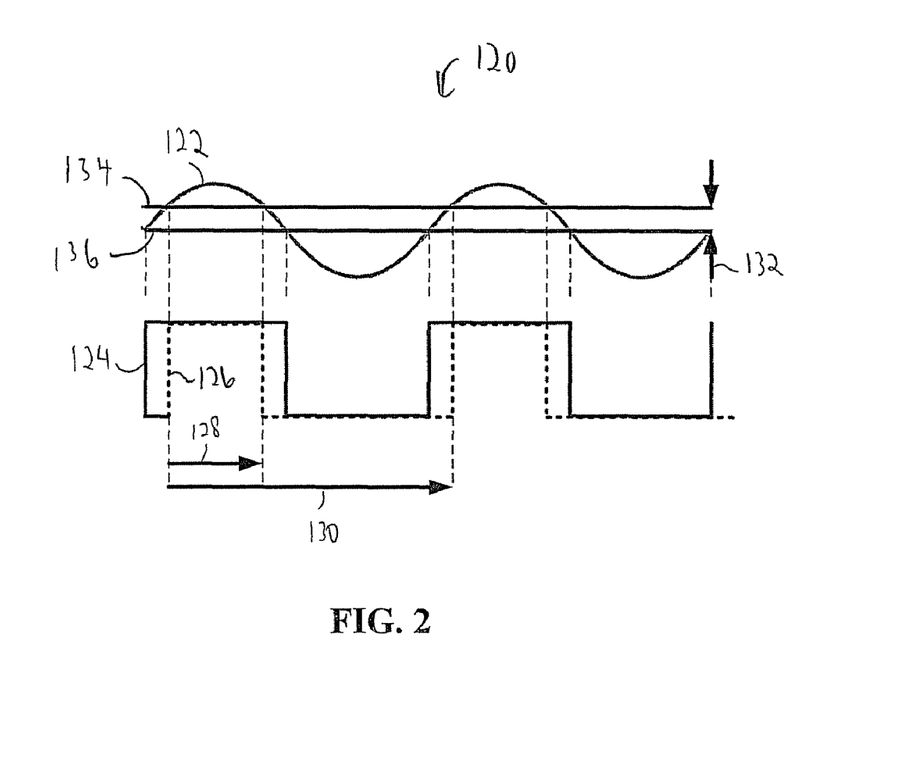
FIG. 2 is a signal diagram illustrating one embodiment of signals of a sensor system.

FIG. 2 is a signal diagram 120 illustrating one embodiment of signals of a sensor system, such as sensor system 100 previously described and illustrated with reference to FIG. 1. In one embodiment, sensor 102 outputs a sinusoidal sensing signal as indicated at 122 on AS1 signal path 104. If sensing signal 122 includes an offset as indicated at 132 and if the offset is not removed by signal processing circuit 106, then the comparator switching level is indicated at 134, which would provide an OUTPUT signal on OUTPUT signal path 108 as indicated by signal 126. Due to the offset of sensing signal 122, signal 126 has a high signal time as indicated at 128 and a signal period as indicated at 130. Therefore, the duty cycle of signal 126 is the high signal time divided by the signal period, which is not 50%. Without a duty cycle of 50%, the accuracy of signal processing circuit 106 and sensing system 100 is limited.

If the offset of sensing signal 122 is removed by signal processing circuit 106, however, then the comparator switching level is indicated at 136, which provides an OUTPUT signal on OUTPUT signal path 108 as indicated by signal 124. Due to the removal of the offset, signal 124 has a duty cycle of substantially 50%. Therefore, the accuracy of signal processing circuit 106 and sensing system 100 is improved.

Figure 3:
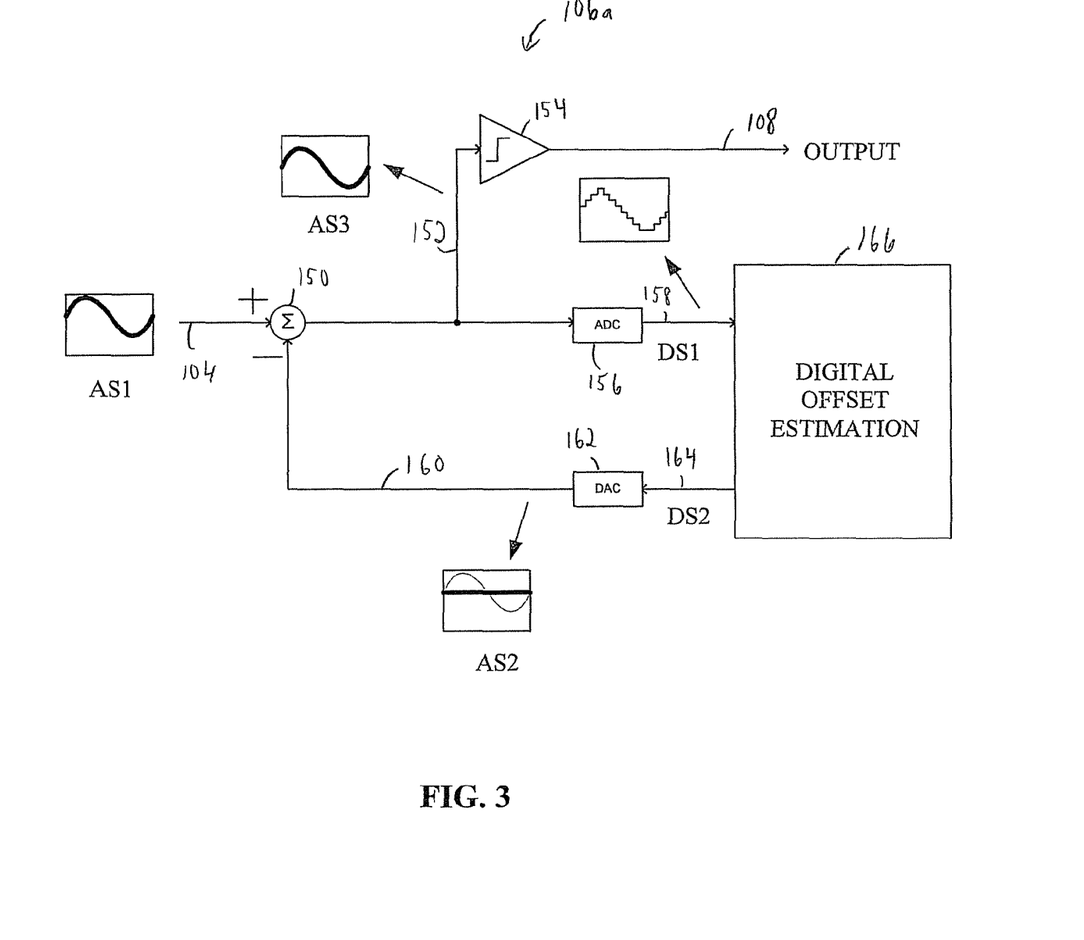
FIG. 3 is a schematic diagram illustrating one embodiment of a signal processing circuit.

FIG. 3 is a schematic diagram illustrating one embodiment of a signal processing circuit 106a. In one embodiment, signal processing circuit 106a provides signal processing circuit 106 previously described and illustrated with reference to FIG. 1. Signal processing circuit 106a includes an analog subtractor 150, a comparator 154, an analog to digital converter (ADC) 156, a digital to analog converter (DAC) 162, and a digital offset estimation circuit 166. The positive input of analog subtractor 150 receives the AS1 signal on AS1 signal path 104. The output of analog subtractor 150 is electrically coupled to the input of comparator 154 and the input of ADC 156 through analog signal (AS3) signal path 152. The output of comparator 154 provides the OUTPUT signal on OUTPUT signal path 108. The output of ADC 156 is electrically coupled to the input of digital offset estimation circuit 166 through digital signal (DS1) path 158. The output of digital offset estimation circuit 166 is electrically coupled to the input of DAC 162 through digital signal (DS2) path 164. The output of DAC 162 is electrically coupled to the negative input of analog subtractor 150 through analog signal (AS2) signal path 160.

Analog subtractor 150 receives the AS1 signal on AS1 signal path 104 and the AS2 signal on AS2 signal path 160 to provide the AS3 signal on AS3 signal path 152. Analog subtractor 150 subtracts the analog AS2 signal from the analog AS1 signal to provide the analog AS3 signal. ADC 156 receives the AS3 signal on AS3 signal path 152 to provide the DS1 signal on DS1 signal path 158. ADC 156 converts the analog AS3 signal to the digital DS1 signal. In one embodiment, the amplitude of the AS3 signal exceeds the range of ADC 156 such that ADC 156 becomes saturated at the upper portions, lower portions, or both upper and lower portions of the AS3 signal. By allowing ADC 156 to become saturated, the use of a more complex ADC having a higher bit width capable of avoiding saturation can be avoided.

Digital offset estimation circuit 166 receives the DS1 signal on DS1 signal path 158 to provide the DS2 signal on DS2 signal path 164. Digital offset estimation circuit 166 includes a microprocessor, microcontroller, or other suitable logic circuitry. Digital offset estimation circuit 166 estimates the offset of the DS1 signal, which is provided as the DS2 signal. In one embodiment, digital offset estimation circuit 166 estimates the offset by comparing the area of the DS1 signal above zero to the area of the DS1 signal below zero. In another embodiment, digital offset estimation circuit 166 estimates the offset by comparing the area of the DS1 signal above a value other than zero to the area of the DS1 signal below the value.

If the area of the DS1 signal above zero is greater than the area of the DS1 signal below zero, then the estimated offset value is less than the offset value of the AS3 signal. In this case, digital offset estimation circuit 166 increases the offset value of the DS2 signal. If, however, the area of the DS1 signal above zero is less than the area of the DS1 signal below zero, then the estimated offset value is greater than the offset value of the AS3 signal. In this case, digital offset estimation circuit 166 decreases the offset value of the DS2 signal. If, however, the area of the DS1 signal above zero equals the area of the DS1 signal below zero, then the estimated offset value is equal to the offset value of the AS3 signal. In this case, digital offset estimation circuit 166 maintains the current offset value of the DS2 signal.

In one embodiment, the areas of the DS1 signal above and below zero are calculated by summation of the DS1 signal values larger and smaller than zero, respectively. In another embodiment, the areas of the DS1 signal above and below zero are calculated separately and then compared. In another embodiment, the area of the DS1 signal above zero is calculated and then the area of the DS1 signal below zero is subtracted from this result (or vice versa). In another embodiment, the areas of the DS1 signal above and below zero are calculated using interpolation or extrapolation. In another embodiment, the areas of the DS1 signal above and below zero are calculated using mathematical methods for numerical integration, such as the trapezoidal rule or Simpson's rule. In other embodiments, other suitable techniques are used to determine the areas of the DS1 signal above and below zero. In another embodiment, an area ratio technique can be used to estimate the offset value. According to this technique, the estimated offset value is varied until the area of the DS1 signal above zero is x-times larger compared to the area of the DS1 signal below zero, wherein the factor x can be constant or variable.

DAC 162 receives the DS2 signal on DS2 signal path 164 to provide the AS2 signal on AS2 signal path 160. DAC 162 converts the digital DS2 signal to the analog AS2 signal. Analog subtractor 150 subtracts the AS2 signal from the AS1 signal to provide the AS3 signal, which is equivalent to an offset free AS1 signal once digital offset estimation circuit 166 determines the optimum DS2 signal to remove the offset value from the AS1 signal.

Comparator 154 receives the AS3 signal on AS3 signal path 152 to provide the OUTPUT signal on OUTPUT signal path 108. Comparator 154 provides a logic high OUTPUT signal in response to the AS3 signal exceeding a threshold value. Comparator 154 provides a logic low OUTPUT signal in response to the AS3 signal being below the threshold value. Therefore, if the offset value has been removed from the AS3 signal and the threshold value is zero, the OUTPUT signal has a duty cycle of substantially 50%.

Figure 4:
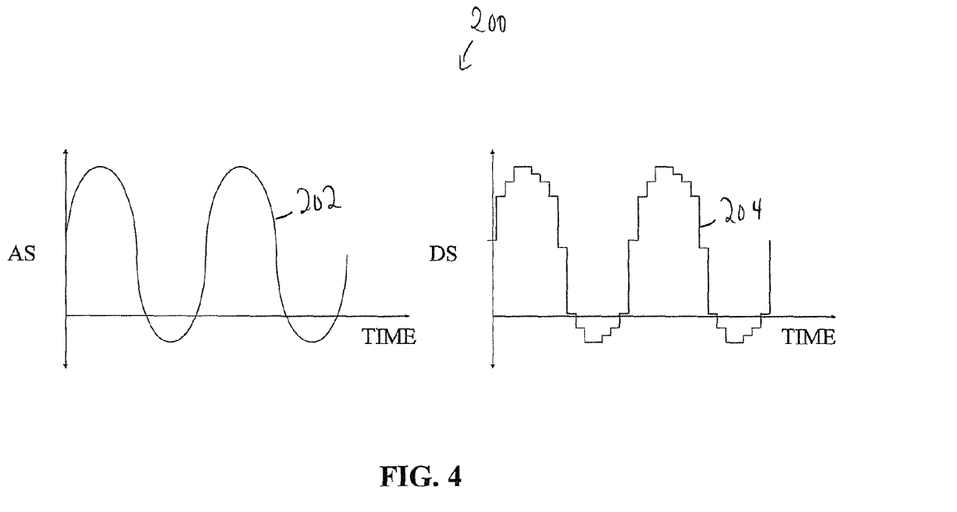
FIG. 4 is a signal diagram illustrating one embodiment of signals of the signal processing circuit.

FIG. 4 is a signal diagram 200 illustrating one embodiment of signals of signal processing circuit 106a previously described and illustrated with reference to FIG. 3. Analog signal 202, such as the AS3 signal on signal path 152 is converted into a digital domain by ADC 156 to provide digital signal 204, such as the DS1 signal on DS1 signal path 158. In this embodiment, the amplitude of analog signal 202 is within the range of ADC 156 such that ADC 156 is not saturated at its upper or lower range limit. The area of digital signal 204 above zero is larger than the area of digital signal 204 below zero indicating that analog signal 202 includes an offset value.

Figure 5:
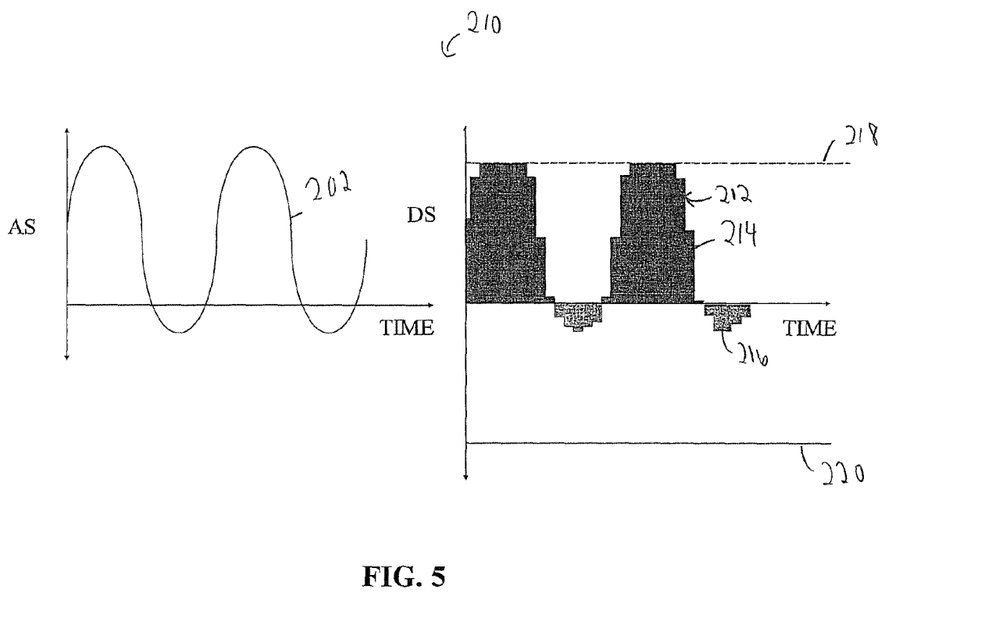
FIG. 5 is a signal diagram illustrating another embodiment of signals of the signal processing circuit.

FIG. 5 is a signal diagram 210 illustrating another embodiment of signals of signal processing circuit 106a. Analog signal 202, such as the AS3 signal on signal path 152 is converted into a digital domain by ADC 156 to provide digital signal 212, such as the DS1 signal on DS1 signal path 158. In this embodiment, the amplitude of analog signal 202 exceeds the range of ADC 156 such that ADC 156 is saturated at its upper range limit. The area of digital signal 212 above zero as indicated at 214 is still greater than the area of digital signal 212 below zero as indicated at 216, even though analog signal 202 exceeds the range of ADC 156 as indicated by the upper range limit at 218 and the lower range limit at 220. Therefore, even though the maximum peak value of analog signal 202 cannot be determined, the offset value of analog signal 202 can still be estimated.

The offset value is estimated by comparing area 214 of digital signal 212 above zero to area 216 of digital signal 212 below zero. If area 214 of digital signal 212 above zero is greater than area 216 of digital signal 212 below zero, then the estimated offset value is less than the offset value of analog signal 202. In this case, digital offset estimation circuit 166 increases the offset value. If, however, area 214 of digital signal 212 above zero is less than area 216 of digital signal 212 below zero, then the estimated offset value is greater than the offset value of analog signal 202. In this case, digital offset estimation circuit 166 decreases the offset value. If, however, area 214 of digital signal 212 above zero equals area 216 of digital signal 212 below zero, then the estimated offset value is equal to the offset value of analog signal 202. In this case, digital offset estimation circuit 166 maintains the current offset value.

Figure 6:
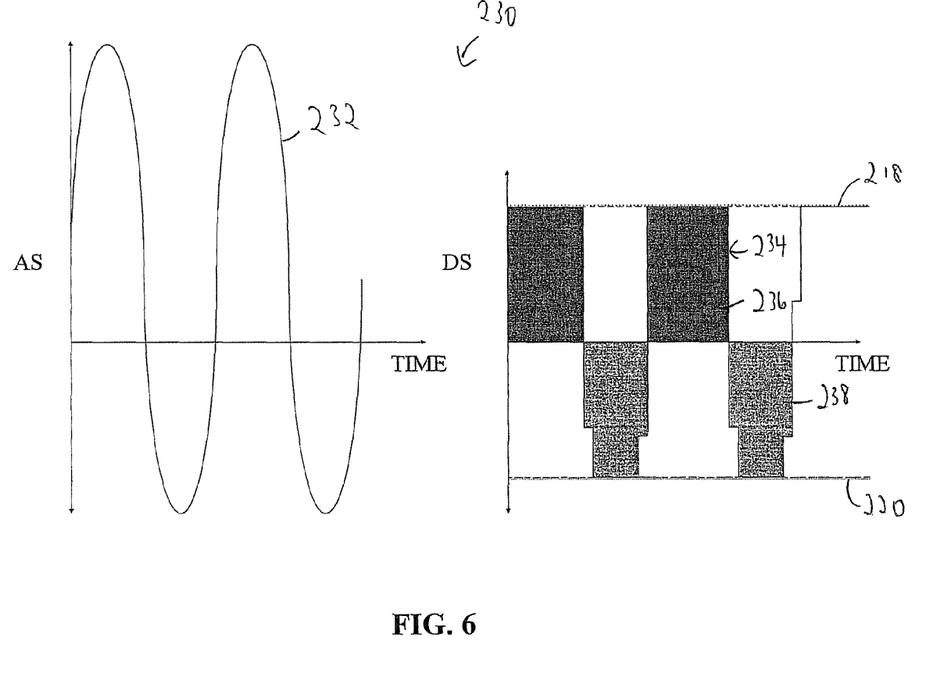
FIG. 6 is a signal diagram illustrating another embodiment of signals of the signal processing circuit.

FIG. 6 is a signal diagram 230 illustrating another embodiment of signals of signal processing circuit 106a. Analog signal 232, such as the AS3 signal on signal path 152 is converted into a digital domain by ADC 156 to provide digital signal 234, such as the DS1 signal on DS1 signal path 158. In this embodiment, the amplitude of analog signal 232 exceeds the range of ADC 156 such that ADC 156 is saturated at its upper range limit and at its lower range limit. The area of digital signal 234 above zero as indicated at 236 is still greater than the area of digital signal 234 below zero as indicated at 238, even though analog signal 232 exceeds the range of ADC 156 as indicated by the upper range limit at 218 and the lower range limit at 220. Therefore, even though the maximum and minimum peak values of analog signal 232 cannot be determined, the offset value of analog signal 232 can still be estimated.

In one embodiment, a chopped Hall effect sensor is used for sensor 102 to detect the magnetic signal of a rotating target wheel. The estimated offset value is varied by digital offset estimation circuit 166 as previously described herein until the area above zero is equal to the area below zero (refer, for example, to FIG. 5). In one embodiment, ADC 156 tracks the signal from the chopped Hall effect sensor only up to a certain value of the signal range, and thus the digital tracking information is clipped. Accordingly, the dynamic range of ADC 156 can be greatly reduced and area for a high-resolution ADC can be saved.

In another embodiment, giant magnetoresistive (GMR) sensors are used for sensor 102 to detect the magnetic signal of a rotating target wheel. In this embodiment, the clamping in the digital domain can be caused by the limited range of ADC 156 or by the nonlinear behavior (e.g., saturation) of the GMR sensors. In another embodiment, based on the application, a desired duty cycle of the OUTPUT signal can be 50% or any other suitable value between 0% and 100%. In other embodiments, other suitable sensors are used for sensor 102 to provide a sensor signal having an offset value. The offset value of the sensor signal can be estimated and removed to provide an output signal even if the sensor signal includes a large amplitude where and the maximum and/or minimum peaks of the sensor signal exceed the range of the ADC.

Figure 7:
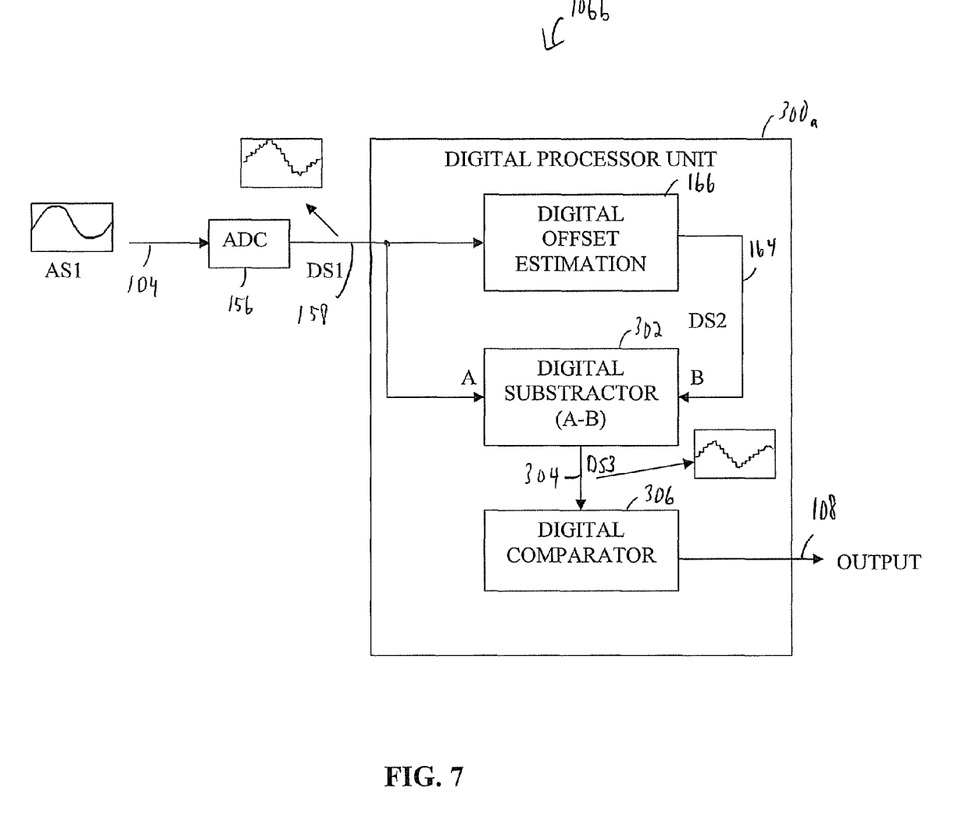
FIG. 7 is a schematic diagram illustrating another embodiment of a signal processing circuit.

FIG. 7 is a schematic diagram illustrating another embodiment of a signal processing circuit 106b. In one embodiment, signal processing circuit 106b provides signal processing circuit 106 previously described and illustrated with reference to FIG. 1. Signal processing circuit 106b includes ADC 156 and a digital processor unit 300a. Digital processor unit 300a includes a microprocessor, microcontroller, or other suitable logic circuitry. Digital processor unit 300a includes digital offset estimation circuit 166, a digital subtractor 302, and a digital comparator 306.

The input of ADC 156 receives the AS1 signal on AS1 signal path 104. The output of ADC 156 is electrically coupled to the input of digital offset estimation circuit 166 and input A of digital subtractor 302 through DS1 signal path 158. The output of digital offset estimation circuit 166 is electrically coupled to input B of digital subtractor 302 through DS2 signal path 164. The output of digital subtractor 302 is electrically coupled to the input of digital comparator 306 through digital signal (DS3) signal path 304. The output of digital comparator 306 provides the OUTPUT signal on OUTPUT signal path 108.

ADC 156 receives the AS1 signal on AS1 signal path 104 to provide the DS1 signal on DS1 signal path 158. ADC 156 converts the analog AS1 signal to the digital DS1 signal. In one embodiment, the amplitude of the AS1 signal exceeds the range of ADC 156 such that ADC 156 becomes saturated at the upper portions, lower portions, or both upper and lower portions of the AS1 signal. By allowing ADC 156 to become saturated, the use of a more complex ADC having a higher bit width capable of avoiding saturation can be avoided.

Digital offset estimation circuit 166 receives the DS1 signal on DS1 signal path 158 to provide the DS2 signal on DS2 signal path 164. Digital offset estimation circuit 166 operates as previously described with reference to FIG. 3. Digital subtractor 302 receives the DS1 signal on DS1 signal path 158 and the DS2 signal on DS2 signal path 164 to provide the DS3 signal on DS3 signal path 304. Digital subtractor 302 subtracts the DS2 signal from the DS1 signal to provide the DS3 signal, which is equivalent to an offset free DS1 signal once digital offset estimation circuit 166 determines the optimum DS2 signal to remove the offset value from the DS1 signal.

Digital comparator 306 receives the DS3 signal on DS3 signal path 304 to provide the OUTPUT signal on OUTPUT signal path 108. Digital comparator 306 provides a logic high OUTPUT signal in response to the DS3 signal exceeding a threshold value. Digital comparator 306 provides a logic low OUTPUT signal in response to the DS3 signal being below the threshold value. Therefore, if the offset value has been removed from the DS3 signal and the threshold value is zero, the OUTPUT signal has a duty cycle of substantially 50%.

Figure 8:
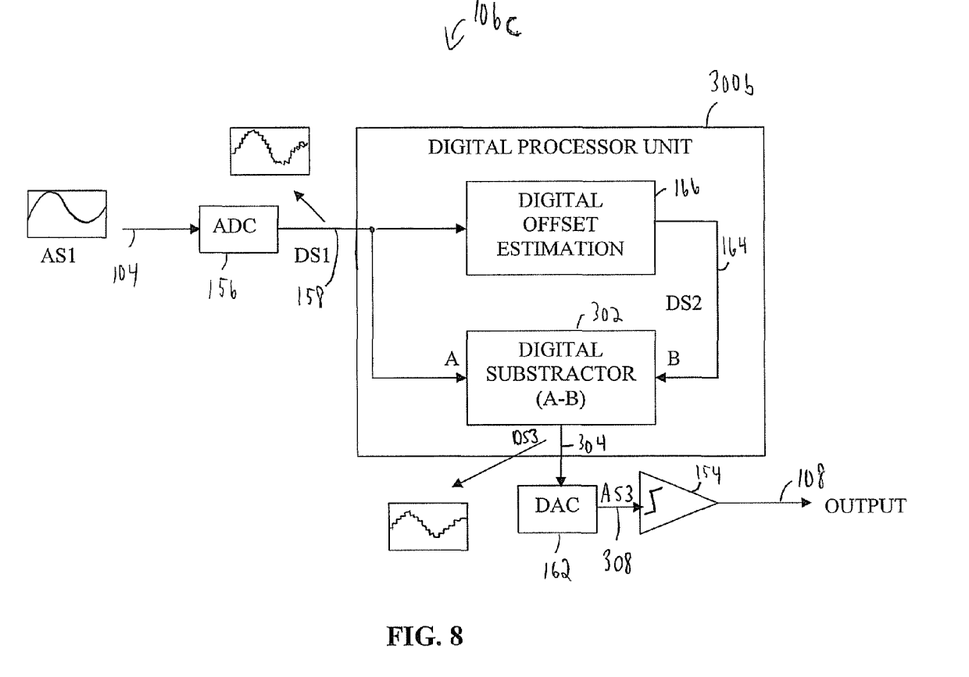
FIG. 8 is a schematic diagram illustrating another embodiment of a signal processing circuit.

FIG. 8 is a schematic diagram illustrating another embodiment of a signal processing circuit 106c. In one embodiment, signal processing circuit 106c provides signal processing circuit 106 previously described and illustrated with reference to FIG. 1. Signal processing circuit 106b includes ADC 156, digital processor unit 300b, DAC 162, and comparator 154. Digital processor unit 300b includes a microprocessor, microcontroller, or other suitable logic circuitry. Digital processor unit 300b includes digital offset estimation circuit 166 and digital subtractor 302.

The input of ADC 156 receives the AS1 signal on AS1 signal path 104. The output of ADC 156 is electrically coupled to the input of digital offset estimation circuit 166 and input A of digital subtractor 302 through DS1 signal path 158. The output of digital offset estimation circuit 166 is electrically coupled to input B of digital subtractor 302 through DS2 signal path 164. The output of digital subtractor 302 is electrically coupled to the input of DAC 162 through DS3 signal path 304. The output of DAC 162 is electrically coupled to the input of comparator 154 through AS3 signal path 308. The output of comparator 154 provides the OUTPUT signal on OUTPUT signal path 108.

ADC 156, digital offset estimation circuit 166, and digital subtractor 302 operate as previously described with reference to FIG. 7. DAC 162 receives the DS3 signal on DS3 signal path 304 to provide the AS3 signal on AS3 signal path 308. DAC 162 converts the digital DS3 signal to the analog AS3 signal. Comparator 154 receives the AS3 signal on AS3 signal path 308 to provide the OUTPUT signal on OUTPUT signal path 108. Comparator 154 operates a previously described with reference to FIG. 3. Therefore, if the offset value has been removed from the AS3 signal and the threshold value is zero, the OUTPUT signal has a duty cycle of substantially 50%.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
    a first circuit to convert a first analog signal to a first digital signal;
    a second circuit coupled to the first circuit to determine an area of the first digital signal above a set value and an area of the first digital signal below the set value to provide a second digital signal indicating an offset of the first analog signal
    a third circuit coupled to the second circuit to convert the second digital signal to provide a second analog signal;
    a fourth circuit coupled to the third circuit to subtract the second analog signal from an analog input signal to provide the first analog signal; and
    a fifth circuit coupled to the fourth circuit to receive the first analog signal and provide a binary signal having a predefined duty cycle.

2. The system of claim 1, wherein the set value is zero.

3. A speed sensor comprising:
    a magnetic field sensor to detect a magnetic signal of a moving target to provide a first analog signal indicating a speed of the moving target;
    an analog subtractor coupled to the magnetic field sensor to subtract a second analog signal from the first analog signal to provide a third analog signal;
    an analog to digital converter coupled to the analog subtractor to convert the third analog signal to a first digital signal;
    a digital offset estimation circuit coupled to the analog to digital converter to compare an area of the first digital signal above a set value to an area of the first digital signal below the set value to provide a second digital signal indicating an offset of the third analog signal;
    a digital to analog converter coupled to the digital offset estimation circuit to convert the second digital signal to provide the second analog signal; and
    a comparator coupled to the analog subtractor to receive the third analog signal and provide a binary signal having a duty cycle of 50%, the binary signal indicating the speed of the moving target.

4. The speed sensor of claim 3, wherein an amplitude of the first digital signal is less than an amplitude of the third analog signal.

5. The speed sensor of claim 3, wherein the first analog signal comprises a sinusoidal signal.

6. The speed sensor of claim 3, wherein the magnetic field sensor comprises one of a Hall effect sensor and a magnetoresistive sensor.

7. The speed sensor of claim 3, wherein the set value is zero.

8. A method for removing an offset from a first analog signal, the method comprising:
    converting the first analog signal to a first digital signal;
    determining an area of the first digital signal above a set value and an area of the first digital signal below the set value to provide a second digital signal indicating an offset of the first analog signal
    converting the second digital signal to a second analog signal;
    subtracting the second analog signal from an analog input signal to provide the first analog signal; and
    providing a binary signal having a predefined duty cycle based on the first analog signal.

9. The method of claim 8, wherein determining the area of the first digital signal above the set value and the area of the first digital signal below the set value comprises determining the area of the first digital signal above zero and the area of the first digital signal below zero to provide the second digital signal indicating the offset of the first analog signal.

10. A method for sensing speed, the method comprising:
    sensing a magnetic signal of a moving target to provide a first analog signal indicating a speed of the moving target;
    subtracting a second analog signal from the first analog signal to provide a third analog signal;
    converting the third analog signal to a first digital signal;
    comparing an area of the first digital signal above a set value to an area of the first digital signal below the set value to provide a second digital signal indicating an offset of the third analog signal;
    converting the second digital signal to provide the second analog signal; and
    receiving the third analog signal and providing a binary signal having a duty cycle of 50%, the binary signal indicating the speed of the moving target.

11. The method of claim 10, wherein sensing the magnetic signal of the moving target to provide the first analog signal comprises sensing the magnetic signal of the moving target to provide a sinusoidal-like signal.

12. The method of claim 10, wherein sensing the magnetic signal of the moving target comprises sensing the magnetic signal of the moving target using one of a Hall effect sensor and a magnetoresistive sensor.

13. The method of claim 10, wherein comparing the area of the first digital signal above the set value to the area of the first digital signal below the set value comprises comparing the area of the first digital signal above zero to the area of the first digital signal below zero to provide the second digital signal indicating the offset of the third analog signal.

14. The method of claim 13, wherein providing the second digital signal comprises:

providing the second digital signal comprising a larger offset in response to the area of the first digital signal above zero being greater than the area of the first digital signal below zero; and providing the second digital signal comprising a smaller offset in response to the area of the first digital signal above zero being less than the area of the first digital signal below zero.

* * * * *